US006228468B1

(12) United States Patent
Vodrahalli

(10) Patent No.: US 6,228,468 B1
(45) Date of Patent: May 8, 2001

(54) HIGH DENSITY CERAMIC BGA PACKAGE AND METHOD FOR MAKING SAME

(75) Inventor: Nagesh K. Vodrahalli, Cupertino, CA (US)

(73) Assignee: Paul L. Hickman, Los Altos, CA (US)

( * ) Notice: Subject to any disclaimer, the term of this patent is extended or adjusted under 35 U.S.C. 154(b) by 0 days.

(21) Appl. No.: 08/901,024

(22) Filed: Jul. 25, 1997

Related U.S. Application Data

(60) Provisional application No. 60/021,006, filed on Jul. 26, 1996.

(51) Int. Cl.[7] ..................................................... B32B 3/00
(52) U.S. Cl. ........................ 428/210; 428/433; 428/697; 428/701; 428/901; 174/258; 501/32
(58) Field of Search ..................................... 428/210, 433, 428/701, 211, 697, 901; 501/32; 174/258

(56) References Cited

U.S. PATENT DOCUMENTS

| | | | |
|---|---|---|---|
| 3,473,999 | * 10/1969 | Muchow | 161/193 |
| 4,256,796 | * 3/1981 | Hang et al. | 428/210 |
| 4,764,233 | * 8/1988 | Ogihara et al. | 501/61 |
| 4,897,509 | * 1/1990 | Holleran et al. | 428/210 |
| 4,943,470 | * 7/1990 | Shiromizu et al. | 428/210 |
| 5,145,540 | * 9/1992 | Foley et al. | 428/210 |
| 5,484,964 | 1/1996 | Dawson et al. | 174/261 |
| 5,635,301 | * 6/1997 | Kondo et al. | 428/210 |
| 5,753,376 | * 5/1998 | Ikuina et al. | 428/210 |

OTHER PUBLICATIONS

Vodrahalli, Nagesh K., "High Density Ceramic BGA with Long Term Reliabilty".
Markstein, Howard, "Packaging Ideas", Electronic Packaging & Production, A Cahners Publication, May 1992.
Ceramic Packaging, pp. 504–505.

* cited by examiner

Primary Examiner—Cathy F. Lam
(74) Attorney, Agent, or Firm—Hickman Stephens Coleman & Hughes, LLP

(57) ABSTRACT

A ceramic substrate for an integrated circuit package comprising a mixture of MgO and a glass, where the material has a coefficient of expansion greater than about 5 PPM/° C. and less than about 16 PPM/° C. In one embodiment, the material includes a low temperature composition glass which sinters in the range of about 600–1400° C., and is provided with metal traces selected from the group consisting essentially of copper, silver, gold and alloys thereof. The material preferably includes 30–80 percent MgO by weight, and the low temperature composition glass sinters in the range of about 900–1100° C. In another embodiment, the material includes a high temperature composition glass which sinters in the range of 1400–1800° C., and wherein the coefficient of expansion of the material is greater than about 8 PPM/° C. and less than about 16 PPM/° C. In this other embodiment, metal traces selected from the group consisting essentially of molybdenum, tungsten, molymanganese, and alloys thereof are provided, and the material includes 50–99 percent MgO by weight and, more preferably, 85–92 percent MgO by weight.

14 Claims, 2 Drawing Sheets

HIGH DENSITY CERAMIC BGA PACKAGE AND METHOD FOR MAKING SAME

CROSS REFERENCE TO RELATED APPLICATIONS

This application claims the benefit of copending provisional patent application number 60/021,006, filed Jul. 26, 1996, the disclosure of which is incorporated herein by reference.

BACKGROUND OF THE INVENTION

This invention relates generally to integrated circuits (ICs), and more particularly to IC packaging.

Ball grid array (BGA) packages are ceramic or organic laminate board packages that are attached to the printed circuit boards (PCBs) by way of solder connections, typically in the form of a solder ball. Prior to the invention of the solder connections, and to the present date, packages called Pin Grid Arrays (PGAs) are used where the connection between the package and the PCBs were long pins made of Alloy 42®, or Kovar®, or copper.

The solder ball connections provide the advantages of better density, lower cost, better electrical performance, and most importantly ease of handling and hence auto loading capabilities compared to the PGAs, since the pins can easily bend. However, solder ball connections suffer the disadvantage of joint reliability during thermal cycling when the substrate material are not matched from a thermal expansion point of view. For example, PCBs typically have a thermal expansion between 13 ppm/° C. to 20 ppm/° C., compared to the commonly used aluminum oxide ceramic of 7 ppm/° C. Other ceramics like Aluminum nitride (4.5 ppm/° C.), and low dielectric constant glass ceramic (2 to 3 ppm/° C.) which have been designed to match the thermal expansion coefficient of Silicon (2.5 ppm/° C.) have even a worse matching to PCBs.

Reliability of the solder ball connection between the package and the PCBs, often referred to in terms of number of thermal fatigue cycles it can withstand, varies as an inverse function (in fact a square dependence following the Coffin-Manson relation) of the thermal expansion coefficient mismatch between package and the PCB, temperature excursion of the cycle and the size of the package, and varies as a direct function with the height of the solder joint. The Coffin-Manson relation is described, for example, in the "Microelectronics Handbook", Pub.Van Nostrand Reinhold, New York, 1989, incorporated herein by reference. See, for example, "Microelectronics Handbook", p295, Chapter 5. Temperature excursion of the cycle for most of the products where these joints used are fixed specified by the product specifications.

Several implications of the Coffin-Manson relation are, for a given substrate/PCB combination, the reliability can be enhanced by increasing the height of the joint, or having the substrate smaller. To have a smaller substrate is a limitation on the functionality, and hence is not a recommended option. Taller joints are an option, and the long solder joints called solder columns have been proposed and used in limited applications. However, these suffer the disadvantages of being not very robust in handling due to lead bending issues, and requiring sophisticated processes that make it expensive compared to solder balls; of course the other main issue with the solder columns is it poses difficulty in testing (and test and burn in) of the packages. There have been other alternatives to increase the life of the joint, like filling of the gap between the package and the PCB with a resin. While this can be an alternative, this does require additional process steps, and it would make the rework of the package almost impossible.

A recent invention, provides for the use of double headed pin to increase the life of the interconnection during thermal cycling. See, for example, "Surface mounting pin grid arrays", Pete Dawson et. al., U.S. Pat. No. 5,484,964, January 1996, incorporated herein by reference. However, there is added cost both for the material and the processing of the double headed pin. Furthermore, there is a handling issue.

Still further, at very high frequencies, long pins have the disadvantage of higher lead inductance, which can be remedied with shorter interconnections like the solder balls. Also, solder ball carriers in the form of a lead frame with over molding with plastic (OMPAC, from Motorola and Citizen), or using an organic laminate package are becoming a more standard package for the low lead count, low cost packages for applications like memory and low pin count application specific integrated circuits.

See, for example, "Pad Array Improves Density", Howard Markstein, Electronic Packaging and Production, May 1992, incorporated herein by reference. A solution to address the high pin count, high density packages both for single chip and multichip packages that will have the similar solder ball connection would be highly desirable.

From the discussion above, matching the thermal expansion coefficients of the PCB and the substrate as an attractive alternative to the problem of joint reliability. Ball Grid Array packages made of organic laminate materials (similar to or same as the PCB) do have very good reliability of the joint that are able to withstand several thousand cycles of accelerated thermal cycling. However, organic laminate substrates do have the limitation of routing densities, especially with respect to the formation of vias between the layers of the substrate. Also, organic laminates tend to be more expensive, when more number of layers for routing are required, or fine density vias are required.

Another approach is the thermal expansion coefficient matching of the PCB itself. There have been solutions like embedding Copper clad Invar types of material in the center of the PCB to bring the expansion coefficient of the PCB close to that of alumina ceramic. But these materials tend to be prohibitively expensive and, since the usage of PCB measured by the area typically happens to be at least an order of magnitude larger than the package, fixing the PCB expansion coefficient would be a very expensive proposition.

Several prior art ceramic packages are illustrated in FIGS. 1a, 1b, and 1c. In FIG. 1a, a prior art ceramic package 10 includes a "flip chip" 12 (ie. an inverted integrated circuit die), interconnects 14, a conventional multi-layer ceramic/organic substrate 16, and a solder ball grid array 18. A resin "underfill" 20 protects the face of the flip chip 12. In FIG. 1b, a prior art ceramic package 22 includes a flip chip 24, a interconnects 26, multilayer ceramic for flip chips 28, resin underfill 30, and column grid array interconnects 32. In FIG. 1c, a prior art ceramic package 34 includes an integrated circuit die ("chip") 36 attached by a die attach 38 to a multi-layer ceramic for wire-bonded devices 40. An alternative to the multi-layer ceramic 40 would be a printed circuit board (PCB). Pads on the die 36 are "wire bonded" to pads on the ceramic 40 with wires 42. The package 34 further includes a pin grid array interconnect 44. The package 10 of the prior art suffers from the thermal incompatibilities discussed above, leading to premature failure of the solder ball grid array 18. The packages 22 and 34 are more resistant to thermal incompatibilities, but suffer from the aforementioned problems of column grid array interconnects.

SUMMARY OF THE INVENTION

The following invention related to solving the BGA joint reliability problem provides a solution that does not have the disadvantages mentioned above, gives the ability to use the high density aspects of multilayer ceramic substrates, and it allows the use of existing infrastructure for manufacturing of the multilayer ceramic without dramatically changing the production costs. It further permits the use of ball grid array interconnects for larger ceramic substrates to be used in single chip packages and multichip packages where routing densities are important, and can most easily be provided by the multilayer ceramic structures at lower cost than available alternatives.

The present invention, by providing for matching the thermal expansion coefficient (TCE) of the package substrate and the PCB material, permits the use of solder ball interconnects, which are robust and are without the handling issues the pinned and solder column packages have. The solder ball interconnections also allow the easy testing of the packages as well. By matching the TCE of the package substrate to that of the PCB material, the present invention provides for robustness and reliability of the solder ball grid array interconnect between the package and the PCB. However, matching the thermal expansion coefficient (TCE) of the package and the PCB leaves open the issue of the TCE matching between the silicon and the package, which also should be matched. However, with the advent of the resin underfill in the case of flip chip devices, and use of highly ductile thermal die attach material in the case of wire bonded and TAB bonded devices, the mismatch between the silicon device and the package has been adequately compensated, and thus providing for the reliability of the silicon-to-package interconnection. Therefore, the invention advantageously provides for the package-to-PCB interconnect reliability, and thus provides for an overall system reliability.

The novel multi-level ceramic substrate of the present invention is described in terms of flip-chip and wire-bonded ceramic packages. The flip-chip package is similar in construction to the prior art flip-chip package described above, but does not suffer from the thermal incompatibilities that cause premature failure of the ball grid array. The wire-bonded ceramic package substitutes a ball grid array for the pin grid array of the prior art, eliminating the problems of the pin grid array.

These and other advantages of the present invention will become apparent upon reading the following detailed descriptions and studying the various figures of the drawings.

DETAILED DESCRIPTION OF THE PREFERRED EMBODIMENTS

The present invention provides a multilayer ceramic package that is closely matched in Thermal Coefficient of Expansion or "TCE" to the Printed Circuit (PCB) board, Le. both the package and the PCB have a TCE of about 10 to 15 ppm/° C. The package of the present invention can be processed, in a high temperature process, similarly to a standard aluminum oxide multilayer ceramic (TCE 7 ppm/° C.) that is used in the industry for the past two decades, or can be processed in a low temperature process similar to more modern low temperature glass ceramic multilayer ceramic substrates that have been tailored for matching the TCE (2.5 to 5 ppm/° C.) to that of silicon, and to have a low dielectric constant (approx. 4). As the values of the dielectric and other thermal properties of the new material are projected to be in the same range as the standard materials used for making multilayer ceramic, the new material has a net advantage over the conventional materials.

Figure 1A:
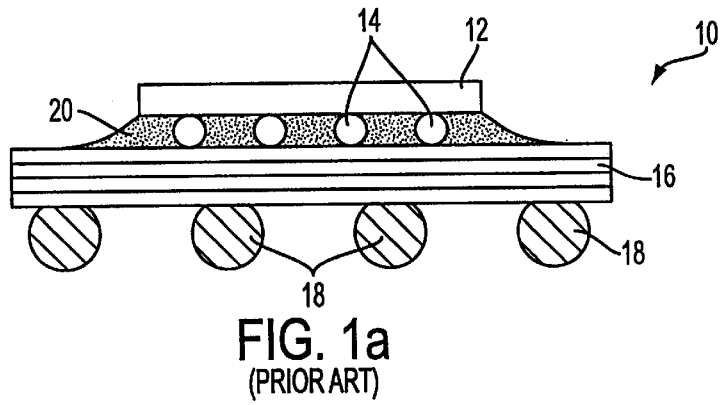
FIGS. 1a, 1b, and 1c illustrate ceramic packages of the prior art.
Figure 1B:
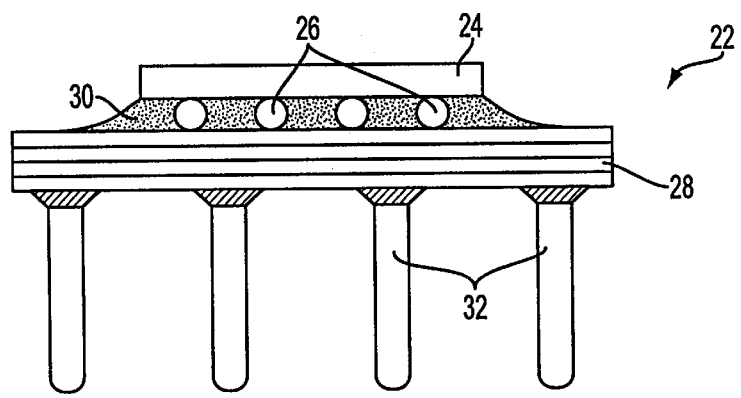
Figure 1C:
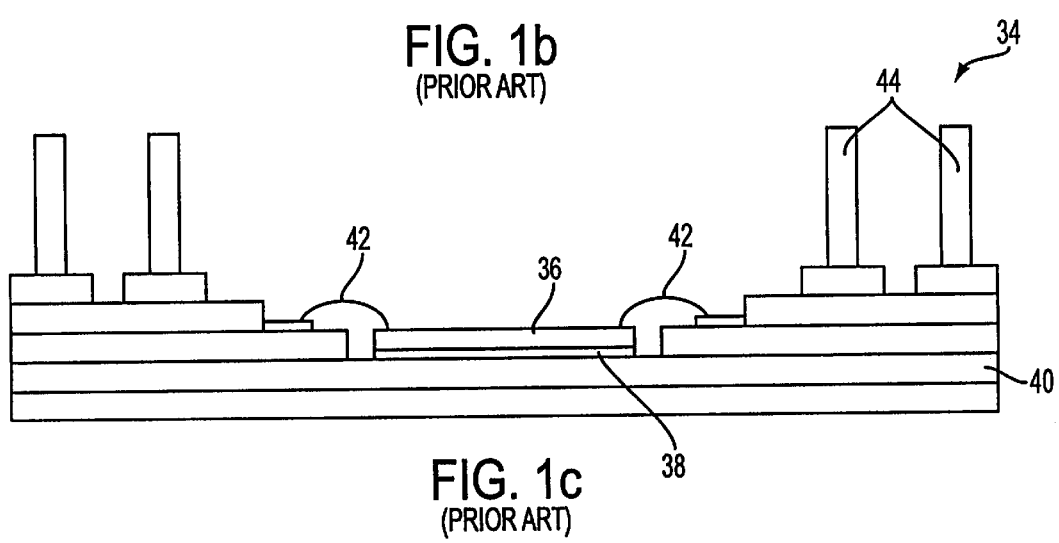
Figure 2:
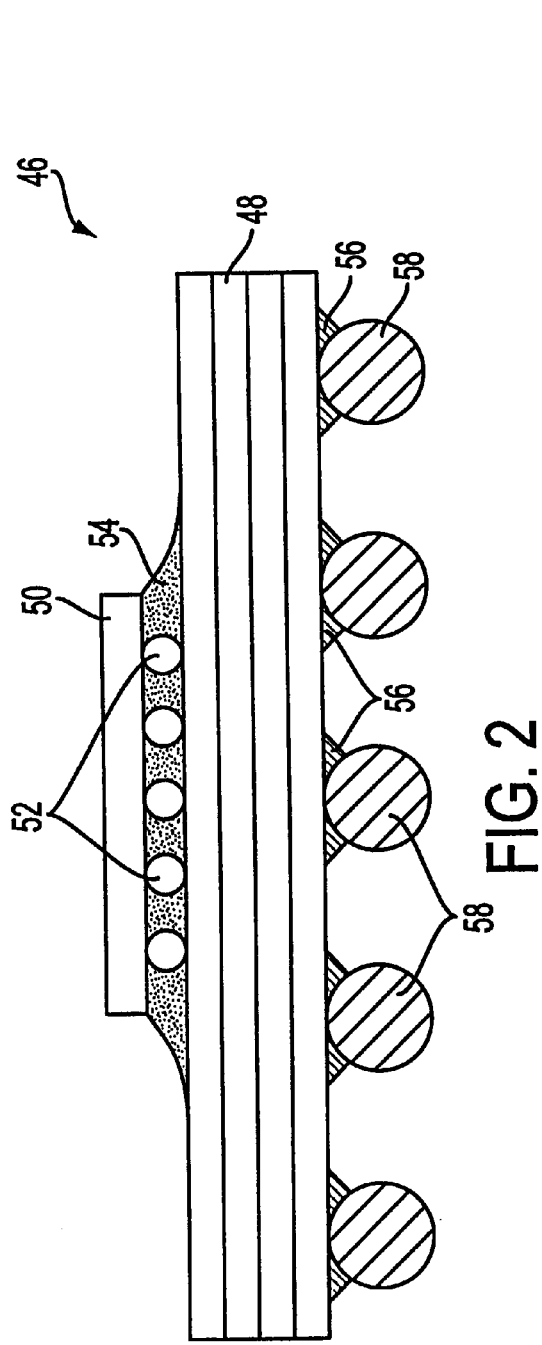
FIG. 2 is a cross-sectional view of a preferred embodiment for a ceramic package of the present invention.

In FIG. 2, a cross-sectional view of a "flip chip" MgO multi-layer ceramic BGA package 46 of the present invention is illustrated. The package 46 includes an MgO multilayer ceramic substrate 48, a flip-chip 50, flip-chip interconnects 52, and resin underfill 54. The chip 50 couples to the substrate 48 at a chip position area or "chip area." The handling of flip-chips, flip-chip interconnects, and resin underfill techniques are well known to those skilled in the art. The package also includes a low temperature solder array 56 for a ball grid array of solder balls 58. The substrate 48 provides electrical interconnections between the solder balls 58 and the circuitry of the flip chip 50, as will be appreciated by those skilled in the art. The substrate 48 of the present invention is manufactured, by techniques to be described hereafter, to have a similar thermal expansion coefficient as a P.C. board. This greatly increases the reliability of the grid array of solder balls 58.

Figure 3:
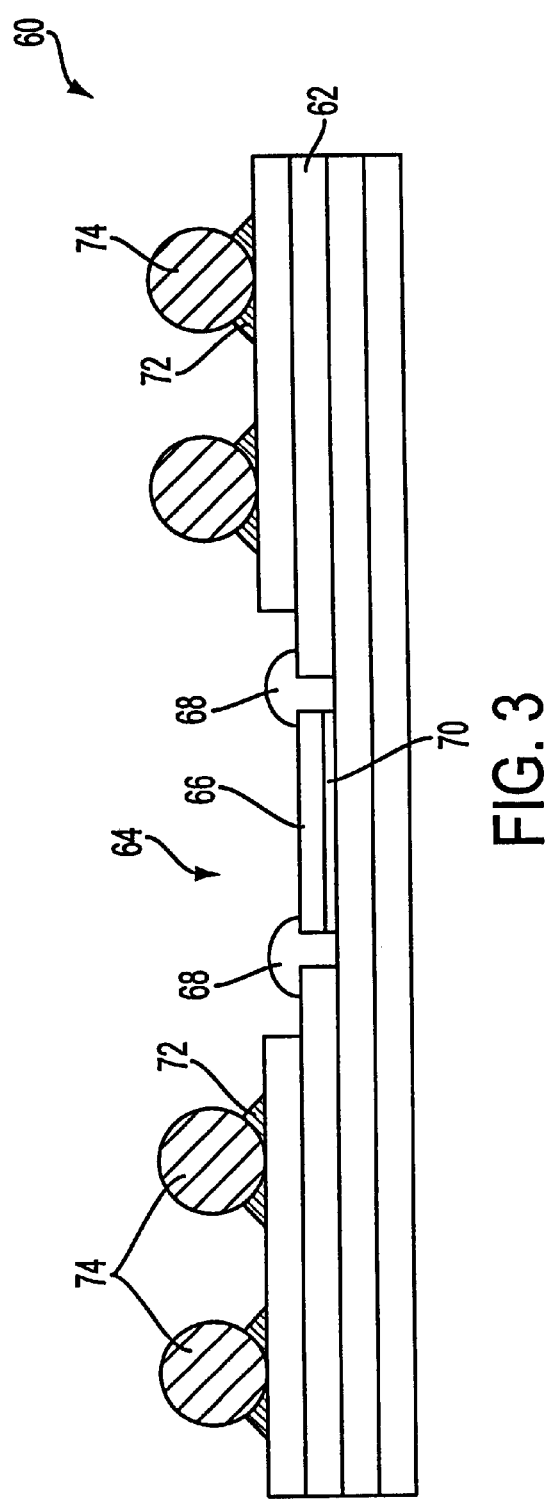
FIG. 3 is a cross-sectional view of another preferred embodiment for a ceramic package of the present invention.

In FIG. 3, a cross-sectional view of a "wire-bonded" MgO multi-layer ceramic BGA package 60 of the present invention is illustrated. The package 60 includes an MgO multi-layer ceramic substrate 62 having a well 64 receptive to an integrated circuit die ("chip") 66. The chip 66 is positioned in a chip area of the substrate 62. Pads on the chip 66 are "wire bonded" to pads on the package 60 with wires 68. The chip 66 is attached to the package 60 by die attach 70. The attachment of dies and wire bonding techniques are well known to those skilled in the art. The package 60 further includes a low temperature solder array 72 for the attachment of a ball grid array of solder balls 74. The substrate 62 provides electrical interconnections between the solder balls 74 and the circuitry of the chip 66, as will be appreciated by those skilled in the art. The substrate 62 of the present invention is manufactured, by techniques to be described hereafter, to have a similar thermal expansion coefficient as a P.C. board. This permits the use of the ball grid array of solder balls 74, as opposed to the pin grid arrays typical in the prior art.

Solder Ball Attachment

The following discussion of solder ball attachment is applicable to packages built by any of the forgoing examples. Solder balls are attached to the interconnect pads that will be connected to the PCB. Solder balls are attached to the package substrate either before or after the chip or device attachment; typically solder balls are attached after the device attachment for flip chip devices. For wire bonded or TABed devices, there is the option to do the device assembly after the attachment of the solder balls. Solder balls used would be high temperature solder balls like 90 w/o lead and 10 w/o tin, but are not limited to this composition. They can be attached by re-melting these balls when there is no device attached, or more advisably, attached using a lower temperature screen/stencil printed solder paste as an initial glue to be subsequently reflowed to form a metallurgical bond. The following process of Table 1 can be used for solder ball attachment:

TABLE 1

Solder Ball Attachment Process

1) Dispense or Screen/Stencil print low temperature (150 to 250° C.) solder on bottom pads of the substrate (with device assembly completed)
2) Place high temperature solder balls on pads with paste
3) Reflow in an oven
4) Flux clean (option for the device assembly for wire bond and TAB devices)

As noted previously, the MgO multilayer ceramic BGA substrate of the present invention can be manufactured using either a high temperature process or a low temperature process. An example of each is set forth below.

EXAMPLE 1

High Temperature Process

In a high temperature process of the present invention for the ceramic substrate fabrication temperatures in the range of 1400° C. to 1800° C., more typically 1500 to 1650° C., are used in the manufacture of the ceramic package. The temperature region also defines or provides the option for the type of metals to be used for conductor circuitry. Most of the advancement in the high temperature ceramic substrates in the past has been to improve thermal conductivity and to reduce the thermal expansion coefficient to match silicon (like the work on aluminum nitride and silicon carbide). The present invention provides a new multilayer ceramic material with different properties to solve the problem mentioned earlier with respect to the package to board solder ball joint reliability.

A major component of the new ceramic multilayer structure is Magnesium oxide combined with glasses compatible with high temperature firing (1400 to 1800° C., more commonly 1500 to 16500 C) in reducing atmospheres common in the multilayer ceramic fabrication industry. The metallization for the electrical circuitry and the vias will be using the commonly used refractory metals like molybdenum, tungsten or similar metals that have a fairly high melting temperature, and are compatible with the high firing temperatures dictated by the ceramic composition. As used herein, the term "traces" will refer to metal associated with the substrate used to conduct electricity. Such traces are formed from metal layers (e.g. solid or screen printed, stenciled, etc. metal layers), vias, pads, etc., as is well known to those skilled in the art.

The magnesium oxide content can vary from 50 wt % to 99 wt %, more typically in the 85 to 92 wt % region, the remainder made up of the glass. The remainder is made up of glass typically a Magnesium alumina-silicate glass or Calcium alumino magnesium silicate glass of a typical composition. The processing, from raw material powder to formulation of green ceramic tape, formation of vias and circuitry lines, sintering or firing, and finally plating or surface preparation are similar to the standard multilayer ceramic processing techniques.

The process flow is as follows. The different chemicals indicated (binders, plasticizers, solvents etc.), the amount and process times are good examples. However, there can be variants to these examples that can be used without substantially changing the end result, a package substrate that is TCE matched to the conventional printed circuit board.

TABLE 2

MgO Multilayer Ceramic Substrate Fabrication

1) Mix MgO & Glass powder ( e.g., 90:10 wt % ratio)
2) Add solvents (e.g., mixture of ethyl alcohol and TCA) & deflocculant (e.g., fish oil; about 0.5 w/o of solids). The solids to liquid ratio is to be such that there is enough liquid to facilitate the milling and mixing of binders and plasticizers. Typical liquid content in relation to the overall solids can be in the region of 30 to 50%.
3) Ball Mill (about 12 to 36 hours)
4) Mix Binder (Butvar - polyvinyl butyral; about 6 w/o of solids) &
5) Plasticizer (dibutyl phthalate, or Benzoflex - dibutyl dibenzoate; about 2 w/o of solids)
6) Ball Mill (about 12 to 36 hours)
7) Filter and de-air
8) Tape Cast
9) Blank
10) Drill/Punch Vias
11) Via Fill, and Print Conductor Circuit Lines
12) Inspect and Laminate different ceramic layers with conductor pattern
13) Shape (if needed)
14) Co-Sinter (Fire) in reducing atmosphere (1400 to 1700° C.)
15) Ni Plate and Diffuse (500 to 800° C., reducing atmosphere)
16) Thin Gold Plate (if needed)

EXAMPLE 2

Low Temperature Process

In a low temperature process of the present invention, the new substrate material has a thermal expansion coefficient in the range of 10 to 15 ppm/° C., matching that of the typical PCBs. Its dielectric, thermal conductivity and mechanical properties would be comparable to the of the standard ceramics substrates.

To produce an MgO multilayer ceramic BGA at "low" temperatures in the range of 600° C. to 1400° C., more typically 900 to 1100° C. This low temperature ceramic, usually combined with appropriate glasses in the range of about 50%, gives the option to use the metals like copper, nickel, (in inert or reducing atmospheres), silver, palladium, gold among other metals. Low temperature ceramics of the prior art had been developed principally for the advantages of low expansion coefficient to match silicon, low dielectric constant, and the use of metals like Cu, Ag, Au, Ni, and Pd. Use of silver, gold, or palladium will allow the use of normal fining atmospheres for the co-sintering step, and the use of copper or nickel will require a nitrogen and/or hydrogen atmosphere with controlled oxygen content as a function of the sintering time and temperature, introduced in the form of moisture (i.e. water vapor is introduced to provide the oxygen). The "Microelectronics Handbook", which is incorporated herein by reference, includes oxygen content needed for the sintering of copper as a function of time/temperature.

The present invention uses Magnesium Oxide as a principal component (30 to 80 wt %). The other major component is an appropriate glass, like the borosilicate family to help reduce the sintering temperature, or the calcium alumino silicate family (near the cordeirite composition). Additional alternative and equivalent glasses are as described in "Microelectronics Handbook", the disclosure of which is incorporated herein by reference. See, for example, "Microelectronics Handbook", p504–505, Chapter 7.

The process flow is similar to the high temperature process flow described above with reference to Table 1 with the following exceptions:

a. Glass used is lower temperature glass, and the contents of the glass can be from 20 to 70 wt %.
b. Metal used can be Cu, Ag, Au or other appropriate lower melting metals to be matched to the glass+ceramic composition.
c. Temperature of sintering can be from 600 to 1400, preferably in the 900 to 1100° C., preceded with an organic burnout step.
d. Depending on the metal choices used, plating or surface preparations to be appropriately modified. Use of Nickel plated metallization is still preferred, as it provides both solder wettability and solder resistance properties; however, diffusion temperature will be substantially lower temperature than used for refractory metallization.

The new substrate material of the present invention has a thermal expansion coefficient in the range of 10 to 15 ppm/° C., matching that of the typical PCBs. Its thermal conductivity and mechanical properties would be comparable to the of the standard glass+ceramic substrates, and the dielectric properties is better than the standard alumina based high temperature ceramic substrates.

Substrate Interconnect Fabrication

In the multilayer ceramic substrate, as is well known in the art, conductor circuitry of appropriate metal of choice in the paste form is screened or stencil printed, and the via holes are filled with a similar metal paste. Once the different layer circuitry is printed, the different layers are inspected, and are stacked in the correct sequence and laminated, under elevated temperatures (e.g. 50–125 degrees Celsius) and pressures (typically several hundred PSI to several thousand PSI). The layers are thus glued, and during the co-sintering step, the organics are burnt out, and at higher temperatures metal particles begin to fuse, as do the ceramic and glass particles. At the end of the sintering, a monolithic body of ceramic (glass plus ceramic) consisting of embedded multiple metal layer structures providing for electrical paths (for signals, power, and ground paths) gets formed.

Surface metal layer is further prepared by applying appropriate metals (such as plated nickel and thin gold) to protect the underlying multilayer ceramic metallization, and to allow the wetting of the solder during solder ball attachment. This application can be done preferentially for the surface consisting of pads intended to accept solder balls, or to the entire substrate including the side that accepts chips, as the surface preparation metals (e.g. nickel and gold) can accept both flip-chip devices, wire-bonded devices, and tape automated bonding (TAB) devices.

It will therefore be appreciated that a ceramic substrate for an integrated circuit package of the present invention includes a ceramic material comprising a mixture of MgO and a glass, where the material has a coefficient of expansion greater than about 5 PPM/° C. and less than about 16 PPM/° C. In a preferred embodiment, the material includes a low temperature composition glass which sinters in the range of about 600–1400° C., and is provided with metal traces selected from the group consisting essentially of copper, silver, gold and alloys thereof, ie. metals compatible with the processing of low temperature glass. In this embodiment, the material preferably includes 30–80 percent MgO by weight, and the low temperature composition glass sinters in the range of about 900–1100° C. In another preferred embodiment, the material includes a high temperature composition glass which sinters in the range of 1400–1800° C., and wherein the coefficient of expansion of the material is greater than about 8 PPM/° C. and less than about 16 PPM/° C. In this other preferred embodiment, metal traces selected from the group consisting essentially of molybdenum, tungsten, molymanganese, and alloys thereof are provided, and the material includes 50–99 percent MgO by weight and, more preferably, 85–92 percent MgO by weight. The disclosed metals for this high-temperature embodiment are compatible with processes for high-temperature glasses. The high temperature composition glass sinters in the range of about 1500–1650° C.

It will also be appreciated that the present invention includes an integrated circuit package including a substrate including a ceramic material comprising: a mixture of MgO and a glass, the material having a coefficient of expansion greater than about 5 PPM/° C. and less than about 16 PPM/° C., the substrate having a pair of sides surfaces, the substrate providing a chip area receptive to an integrated circuit chip; a plurality of solder balls on at least one of the opposing side surfaces; and a plurality of metal traces coupling the plurality of solder balls to a location of the substrate proximate to the chip area. In a preferred embodiment, the plurality of solder balls are provided on a first of the opposing side surfaces, and the chip area is provided on a second of the opposing side surfaces. A plurality of solder bumps are provided at the chip area coupling at least some of the metal traces to the integrated circuit chip. In another preferred embodiment, an integrated circuit chip and a plurality of bonding wires are provided at the chip area coupling at least some of the metal traces to the integrated circuit chip.

Still further, it will be appreciated that the present invention includes a printed circuit board assembly including printed circuit board having a coefficient of expansion greater than about 7 PPM/° C. and less than about 16 PPM/° C., the printed circuit board including a plurality of interconnect bonding pads associated with a packaged integrated circuit; and a packaged integrated circuit including a substrate including a ceramic material comprising a mixture of MgO and a glass, the material having a coefficient of expansion greater than about 5 PPM/° C. and less than about 16 PPM/° C., the substrate having a pair of sides surfaces, the substrate providing a chip area receptive to an integrated circuit chip; a plurality of solder balls on at least one of the opposing side surfaces; a plurality of metal traces coupling the plurality of solder balls to a location of the substrate proximate to the chip area; and an integrated circuit positioned at the chip area and electrically coupled to the metal traces. The plurality of solder balls of the packaged integrated circuit are electrically and mechanically coupled to the plurality of I.C. bonding pads of the printed circuit board.

A process for making a substrate for an integrated circuit package in accordance with the present invention includes: mixing MgO particles with glass particles in a solvent medium to form a slurry, the MgO being in the range of about 30–99 weight percent between the MgO and the glass; forming a tape segment from the slurry that comprises a substrate; and providing a plurality of metal traces supported by the substrate. A preferred embodiment of the process of the present invention forms a plurality of tape segments from the slurry; laminates the plurality of tape segments with a plurality of interconnected conductive layers comprising the metal traces; and sinters the plurality of tape segments and the conductive layers to form the substrate. The process further preferably includes providing a solder-compatible finish to a portion of the metal traces on at least one surface of the substrate, and forming solder balls on at least some of the metal traces on the at least one surface of the substrate that have been provided with a solder-compatible surface.

While this invention has been described in terms of several preferred embodiments, there are alterations, permutations, and equivalents which fall within the scope of this invention. It should also be noted that there are may alternative ways of implementing both the process and apparatus of the present invention. It is therefore intended that the following appended claims include all such alterations, permutations, and equivalents as fall within the true spirit and scope of the present invention.

What is claimed is:

1. A multilayer ceramic substrate for an integrated circuit package comprising:

a first layer formed of a ceramic material comprising a mixture of MgO and a glass, said material including 50 to 99 percent MgO by weight, and having a coefficient of expansion greater than about 5 PPM/° C. and less than about 16 PPM/° C.; and a second layer formed of a ceramic material coupled to said first layer, said second layer comprising a mixture of MgO and a glass, said material including 50 to 99 percent MgO by weight, and having a coefficient of expansion greater than about 5 PPM/° C. and less than about 16 PPM/° C.

2. A multilayer ceramic substrate as recited in claim 1 wherein said glass sinters in the temperature range of about 600–1400° C.

3. A ceramic substrate as recited in claim 2 further comprising metal traces selected from the group consisting essentially of copper, silver, gold and alloys thereof.

4. A multilayer ceramic substrate as recited in claim 2 wherein said glass sinters in the temperature range of about 900–1100° C.

5. A multilayer ceramic substrate as recited in claim 1 wherein said glass sinters in the temperature range of 1400–1800° C., said material having a coefficient of expansion greater than about 8 PPM/° C. and less than about 16 PPM/° C.

6. A ceramic substrate as recited in claim 5 further comprising metal traces selected from the group consisting essentially of molybdenum, tungsten, molymanganese, and alloys thereof.

7. A ceramic substrate as recited in claim 5 wherein said glass sinters in the temperature range of about 1500–1650° C.

8. A multilayer ceramic substrate as recited in claim 1 wherein
    said material has a coefficient of expansion greater than about 6.6 PPM/° C. and less than about 16 PPM/° C.

9. A ceramic substrate as recited in claim 8 wherein said glass sinters in the temperature range of about 600–1400° C.

10. A ceramic substrate as recited in claim 9 further comprising metal traces selected from the group consisting essentially of copper, silver, gold and alloys thereof.

11. A ceramic substrate as recited in claim 9 wherein said glass sinters in the temperature range of about 900–1100° C.

12. A multilayer ceramic substrate for an integrated circuit package comprising:

a first layer formed of a ceramic material comprising a mixture of MgO and a glass, said material having a coefficient of expansion greater than about 5 PPM/° C. and less than about 16 PPM/° C.;

wherein said glass sinters in the temperature range of about 600–1400° C.;

wherein said material includes 50–99 percent MgO by weight; and a second layer formed of a ceramic material coupled to said first layer, said second layer comprising a mixture of MgO and a glass, said material having a coefficient of expansion greater than about 5 PPM/° C. and less than about 16 PPM/° C.

13. A ceramic substrate for an integrated circuit package comprising:

a ceramic material comprising a mixture of MgO and a glass, said material having a coefficient of expansion greater than about 8 PPM/° C. and less than about 16 PPM/° C.;

wherein said glass sinters in the temperature range of 1400–1800° C.; and wherein the material includes 50–99 percent MgO by weight.

14. A ceramic substrate as recited in claim 13 wherein said material includes 85–92 percent MgO by weight.

* * * * *